US011437337B2

(12) United States Patent
Li et al.

(10) Patent No.: US 11,437,337 B2
(45) Date of Patent: Sep. 6, 2022

(54) USING ELECTRICAL CONNECTIONS THAT TRAVERSE SCRIBE LINES TO CONNECT DEVICES ON A CHIP

(71) Applicant: Alibaba Group Holding Limited, Grand Cayman (KY)

(72) Inventors: Shuangchen Li, Hangzhou (CN); Wei Han, Hangzhou (CN); Dimin Niu, Hangzhou (CN); Yuhao Wang, Hangzhou (CN); Hongzhong Zheng, Hangzhou (CN)

(73) Assignee: Alibaba Group Holding Limited, Grand Cayman (KY)

( * ) Notice: Subject to any disclaimer, the term of this patent is extended or adjusted under 35 U.S.C. 154(b) by 155 days.

(21) Appl. No.: 16/847,256

(22) Filed: Apr. 13, 2020

(65) Prior Publication Data

US 2021/0320080 A1   Oct. 14, 2021

(51) Int. Cl.
*H01L 21/82*   (2006.01)
*H01L 25/065*   (2006.01)
*H01L 23/00*   (2006.01)

(52) U.S. Cl.
CPC ............. *H01L 24/29* (2013.01); *H01L 21/82* (2013.01); *H01L 24/20* (2013.01); *H01L 24/83* (2013.01)

(58) Field of Classification Search
CPC ......... H01L 24/29; H01L 21/82; H01L 24/20; H01L 24/83
USPC .......................... 257/734; 438/411, 461, 611
See application file for complete search history.

(56) References Cited

U.S. PATENT DOCUMENTS

| | | | |
|---|---|---|---|
| 8,273,610 B2 | 9/2012 | Or-Bach et al. | |
| 8,357,975 B2 | 1/2013 | Stuber et al. | |
| 8,362,482 B2 | 1/2013 | Or-Bach et al. | |
| 8,507,321 B2 | 8/2013 | Lin et al. | |
| 8,754,533 B2 | 6/2014 | Or-Bach et al. | |
| 8,912,646 B2 | 12/2014 | Stuber et al. | |
| 8,921,168 B2 | 12/2014 | Stuber et al. | |
| 8,952,501 B2 | 2/2015 | Huang et al. | |
| 8,963,312 B2 | 2/2015 | Ho et al. | |
| 9,030,858 B2 | 5/2015 | Or-Bach et al. | |
| 9,117,749 B1 | 8/2015 | Or-Bach et al. | |
| 9,355,975 B2 | 5/2016 | Ho et al. | |
| 9,390,474 B2 | 7/2016 | Laine et al. | |
| 9,484,387 B2 | 11/2016 | Shizukuishi | |
| 9,633,935 B2 | 4/2017 | Ho et al. | |
| 9,673,154 B2 | 6/2017 | Tsutsue et al. | |
| 9,716,080 B1 | 7/2017 | Chuang et al. | |
| 9,773,844 B2 | 9/2017 | Ravasio et al. | |
| 9,899,377 B2 | 2/2018 | Schulze et al. | |
| 10,128,211 B2 | 11/2018 | Chang et al. | |
| 10,199,354 B2 | 2/2019 | Modi et al. | |
| 10,224,279 B2 | 3/2019 | Or-Bach et al. | |
| 2013/0214385 A1* | 8/2013 | Do ...................... | H01L 21/6835 257/528 |
| 2015/0076665 A1* | 3/2015 | Shiu ...................... | H01L 23/544 257/620 |

(Continued)

*Primary Examiner* — Didarul A Mazumder

(57) ABSTRACT

A chip or integrated circuit includes a layer that includes a first device and a second device. A scribe line is located between the first device and the second device and separates the first device from the second device. An electrically conductive connection traverses the scribe line and is coupled to the first device and the second device, thus connecting the first and second devices.

10 Claims, 7 Drawing Sheets

(56) References Cited

U.S. PATENT DOCUMENTS

2018/0294230 A1* 10/2018 Dabral .................. H01L 23/522
2021/0159179 A1* 5/2021 Elsherbini ........... H01L 23/5385

* cited by examiner

USING ELECTRICAL CONNECTIONS THAT TRAVERSE SCRIBE LINES TO CONNECT DEVICES ON A CHIP

BACKGROUND

FIG. 1 illustrates a conventional structure 100 that is used in the manufacture of stacked chips. The structure 100 includes, for example, a first layer that includes a number of processing elements (PEs) 102 and an adjoining metal layer 104, and a second layer that includes a like number of memory elements (MEs) 106 coupled to an adjoining metal layer 108. The first layer and the second layer are bonded to each other by, for example, a hybrid bonding layer 110.

Each pair of neighboring processing elements 102 is separated from each other by a respective scribe line 112, and each pair of neighboring memory elements 106 is separated from each other by a respective scribe line 114. As part of the manufacturing process, the structure 100 is cut along the scribe lines 112 and 114 to produce individual units (e.g., individual stacked chips), each of the chips consisting of a single block that includes one of the processing elements 102 and one of the memory elements 106. This is known as a block-based design.

One purpose of the scribe lines 112 and 114 is to protect the circuitry and other components in the processing elements 102 and the memory elements 106 from damage during the cutting process. As such, the regions occupied by the scribe lines 112 and 114 do not contain wiring or other components that are connected to the processing elements 102 or memory elements 106. Thus, each processing element 102 is isolated from its neighboring processing elements, and similarly each memory element 106 is isolated from its neighboring memory elements.

Chips that include one block (a single processing element and a single memory element) per chip are useful in devices such as telecommunication devices. There are other, more complex applications (e.g., data centers) that require greater computational and memory resources than that provided by single-block chips. Larger chips that include more than one block per chip would be advantageous in those more complex applications. However, as described above, inter-block communication is not possible between individual blocks that are isolated from each other. As such, block-based designs that include a single block per chip are not readily scalable to applications that require larger chips.

SUMMARY

Embodiments according to the present invention provide a solution to the problems described above. Embodiments according to the present invention pertain to larger, multi-block chips that include features that allow communication around or bypassing scribe lines and therefore between the blocks. Embodiments according to the present invention also pertain to manufacturing processes that allow block-based stacked chips to be scaled to larger, multi-block chips.

In embodiments, a stacked chip or integrated circuit includes a first layer that includes a first device and a second device. For example, the first device may be a processing element, and the second device may be a processing element. A first scribe line is located between the first device and the second device and separates the first device from the second device. An electrically conductive connection (an inter-block connection) traverses the scribe line and is coupled to the first device and the second device.

In embodiments, the stacked chip or integrated circuit also includes a second layer that includes a third device and a fourth device. For example, the third device may be a memory element, and the fourth device may be a memory element. A hybrid bonding layer is located between the first layer and the second layer. A second scribe line is located between the third device and the fourth device and separates the third device from the fourth device. In these embodiments, the inter-block connection is located between the first layer and the second layer.

In an embodiment, the inter-block connection is achieved with a network-on-a-chip (NOC) interconnection architecture layer. In another embodiment, the inter-block connection is achieved with a back-end-of-line (BEOL) layer. In yet another embodiment, the inter-block connection is achieved with a redistribution layer (RDL). In still another embodiment, the inter-block connection is located between the hybrid bonding layer and the second layer, and is achieved using a layer (e.g., a NOC interconnection architecture layer or a BEOL layer) and also using the hybrid bonding layer.

In embodiments, the stacked chip or integrated circuit also includes a third scribe line located between the first device and the second device, and a volume of metal is located between the first scribe line and the third scribe line. In these embodiments, the inter-block connection includes a path from a first metal layer of the first layer through the hybrid bonding layer, a first metal layer of the second layer, the hybrid bonding layer, the volume of metal, the hybrid bonding layer, a second metal layer of the second layer, and the hybrid bonding layer, to a second metal layer of the first layer.

Thus, embodiments according to the invention enable communication around scribe lines and between blocks, and allow block-based stacked chips to be scaled to larger, multi-block chips.

These and other objects and advantages of the various embodiments of the present invention will be recognized by those of ordinary skill in the art after reading the following detailed description of the embodiments that are illustrated in the various drawing figures.

BRIEF DESCRIPTION OF DRAWINGS

The accompanying drawings, which are incorporated in and form a part of this specification and in which like numerals depict like elements, illustrate embodiments of the present disclosure and, together with the detailed description, serve to explain the principles of the disclosure.

DETAILED DESCRIPTION

Figure 1:
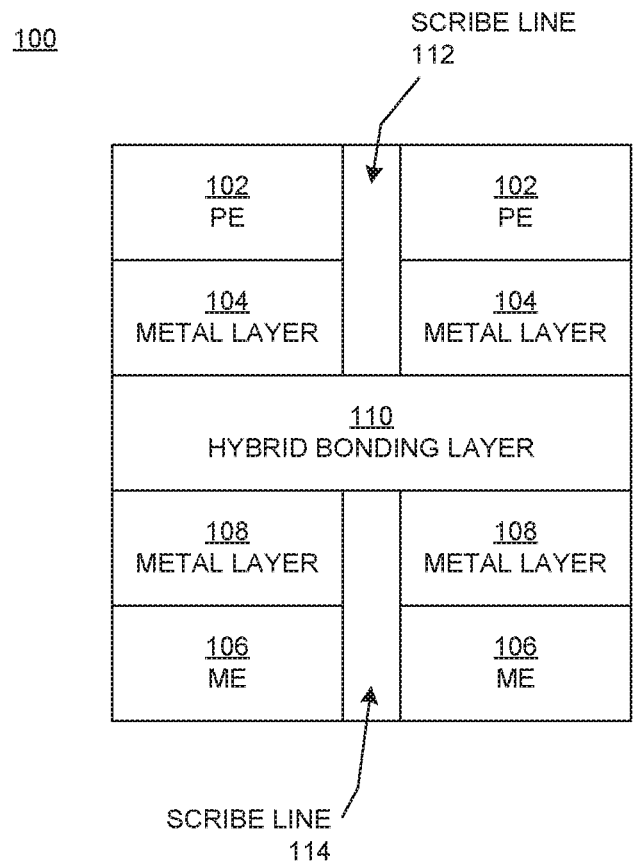
FIG. 1 is a block diagram illustrating a conventional structure used in the manufacture of a block-based integrated circuit or chip.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "forming," "connecting," "bonding," "depositing," or the like, refer to actions and processes (e.g., the flowchart 700 of FIG. 7) of semiconductor device fabrication. A "layer" can include one or more layers: it may refer to a single layer, or it may refer to a layer that includes other layers (sub-layers). A structure, chip, integrated circuit, or the like may be referred to herein as an article of manufacture.

It is understood that the figures are not necessarily drawn to scale, and only portions of the devices and structures depicted, as well as the various layers that form those structures, are shown. For simplicity of discussion and illustration, only one or two devices or structures may be described, although in actuality more than one or two devices or structures may be present or formed. Also, while certain elements, components, and layers are discussed, embodiments according to the invention are not limited to those elements, components, and layers. For example, there may be other elements, components, layers, and the like in addition to those discussed.

Figure 2:
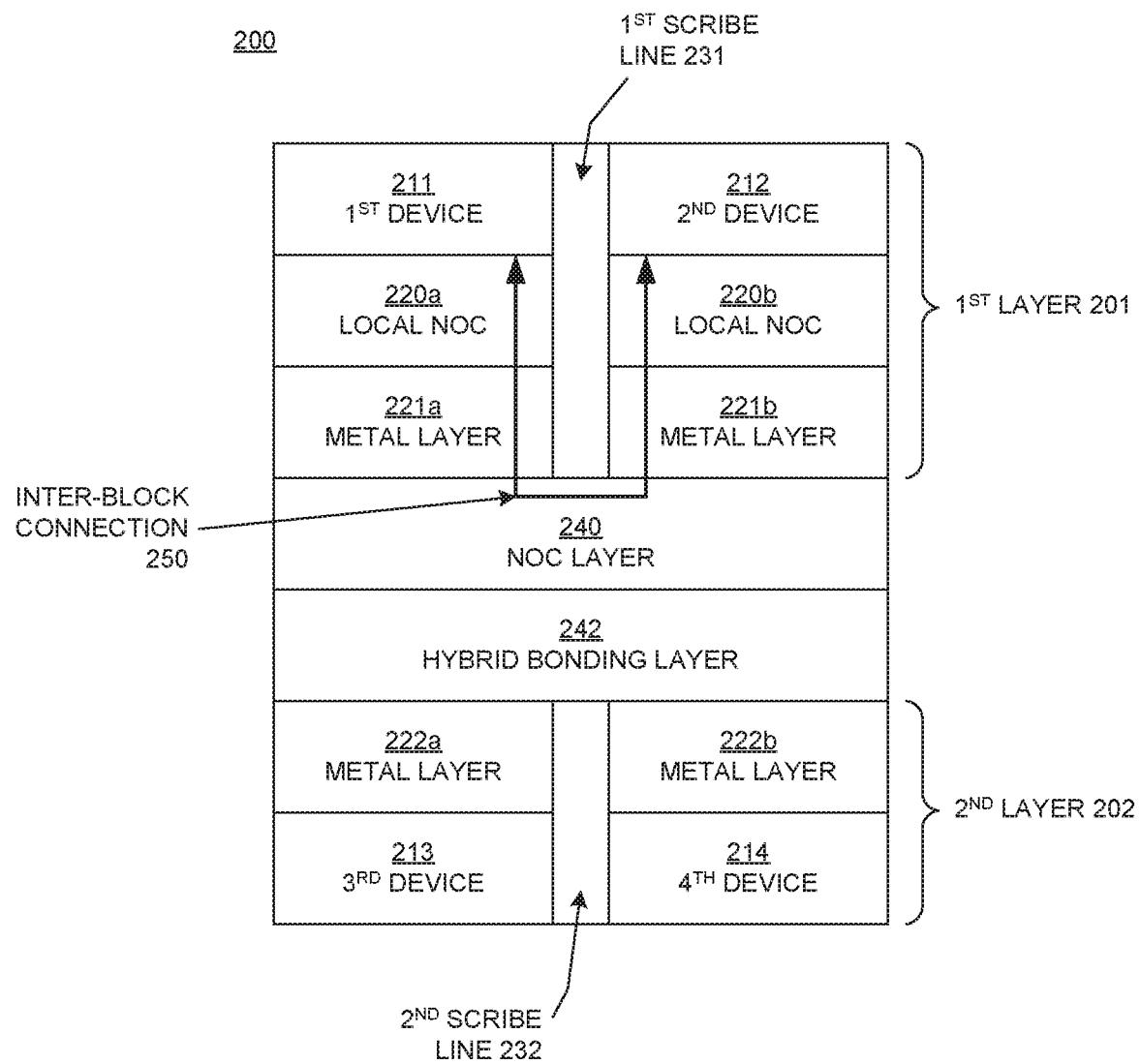
FIGS. 2, 3, 4, 5, and 6 are block diagrams of multi-block stacked chips, in embodiments according to the present invention.

FIG. 2 is a block diagram of a multi-block chip or multi-block integrated circuit, referred to herein as a stacked chip 200, in embodiments according to the present invention.

The stacked chip 200 includes a first layer 201 that includes a first device 211 and a second device 212. The first device 211 may be, but is not limited to, a first processing element, and the second device 212 may be, but is not limited to, a second processing element. In general, a processing element is, for example, a general-purpose processor core capable of executing one or more processes. A processing element may be, but is not limited to, a central processing unit (CPU).

The first layer 201 also includes local network-on-a-chip (NOC) architecture layers 220a and 220b and metal layers 221a and 221b. The local NOC architecture layers 220a and 220b interconnect components in the adjacent processing element. That is, for example, the local NOC architectural layer 220a connects components in the first device 211 to each other. Generally speaking, a NOC architecture layer includes a two-dimensional or three-dimensional wire mesh topology.

A first scribe line 231 is located between the first device 211 and the second device 212, and separates the first device from the second device. The first scribe line 231 also extends into and through the NOC architecture layers 220a and 220b and the metal layers 221a and 221b.

In embodiments, the stacked chip 200 also includes a second layer 202 that includes a third device 213 and a fourth device 214. The third device 213 may be, but is not limited to, a memory element, and the fourth device 214 may be, but is not limited to, a memory element. A memory element may be, but is not limited to, a dynamic random-access memory (DRAM) or a static RAM (SRAM). Alternatively, the third device 213 and/or the fourth device 214 may be processing elements.

The second layer 202 also includes metal layers 222a and 222b. A second scribe line 232 is located between the third device 213 and the fourth device 214, and separates the third device from the fourth device. The second scribe line 232 also extends into and through the metal layers 222a and 222b.

A hybrid bonding layer 242 is located between the first layer 201 and the second layer 202. Hybrid bonding, in general, describes a type of bonding that combines metal interconnects with some other form of bonding (e.g., silicon fusion bonding). That is, a hybrid bond can include wiring, for example, that permits communication between layers that are bonded by the hybrid bond. Thus, communication between, for example, the first device 211 and the third device 213 can occur through the hybrid bonding layer 242.

In the FIG. 2 embodiments, an electrically conductive connection (an inter-block connection 250) traverses (bypasses; extends across or around) the first scribe line 231 and is connected to the first device 211 and the second device 212. The inter-block connection 250 is located between the first layer 201 and the second layer 202, below the scribe line 231 (with respect to the orientation of the stacked chip 200 in FIG. 2). Specifically, the inter-block connection 250 is located between the hybrid bonding layer 242 and the first layer 201, and is achieved using a second, or global, NOC interconnection architecture layer 240 that includes wiring that connects the first device 211 and the second device 212.

The inter-block connection 250 thus permits communication (e.g., an exchange of electric signals) between the first device 211 and the second device 212. Other devices in the first layer 201 can be similarly connected: for example, a third device can be connected to the second device 212 via another inter-block connection that traverses a scribe line between the second and third devices, and so on.

Figure 3:
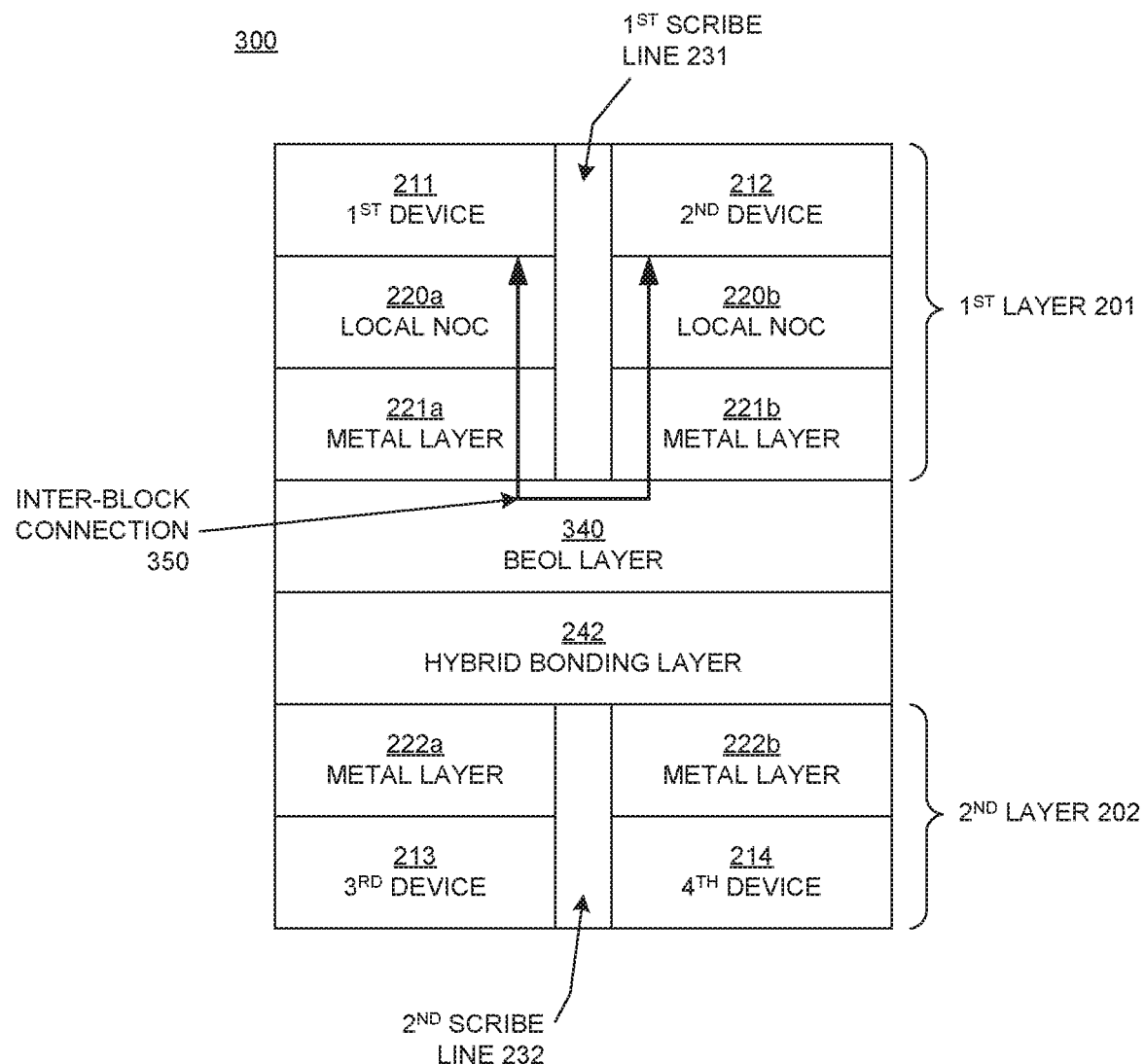

FIG. 3 is a block diagram of a multi-block chip or multi-block integrated circuit, referred to herein as a stacked chip 300, in embodiments according to the present invention.

Similar to the stacked chip 200 of FIG. 2, the stacked chip 300 includes an electrically conductive connection (an inter-block connection 350) that traverses the first scribe line 231 and is connected to the first device 211 and the second device 212.

In contrast to the stacked chip 200, the inter-block connection 350 is achieved using a back-end-of-line (BEOL) layer 340 that includes wiring that connects the first device 211 and the second device 212.

The inter-block connection 350 thus permits communication (e.g., an exchange of electric signals) between the first device 211 and the second device 212. Other devices in the first layer 201 can be similarly connected.

Furthermore, in contrast to the NOC interconnection architecture layer 240, the BEOL layer 340 (and inter-block connection 350) can be added to stacked chips only when those stacked chips are intended for more complex uses (e.g., data centers) that require a multi-block chip. In other words, if the end-user (e.g., customer) intends to use the stacked chips in devices that require only a single-block chip, then the BEOL layer 340 need not be formed when the chips are manufactured or when the devices in the first layer 201 are manufactured. On the other hand, if the end-user intends to use the stacked chips in devices that require a multi-block chip, then the BEOL layer 340 is formed when the chips are manufactured or when the devices in the first layer 201 are manufactured.

Figure 4:
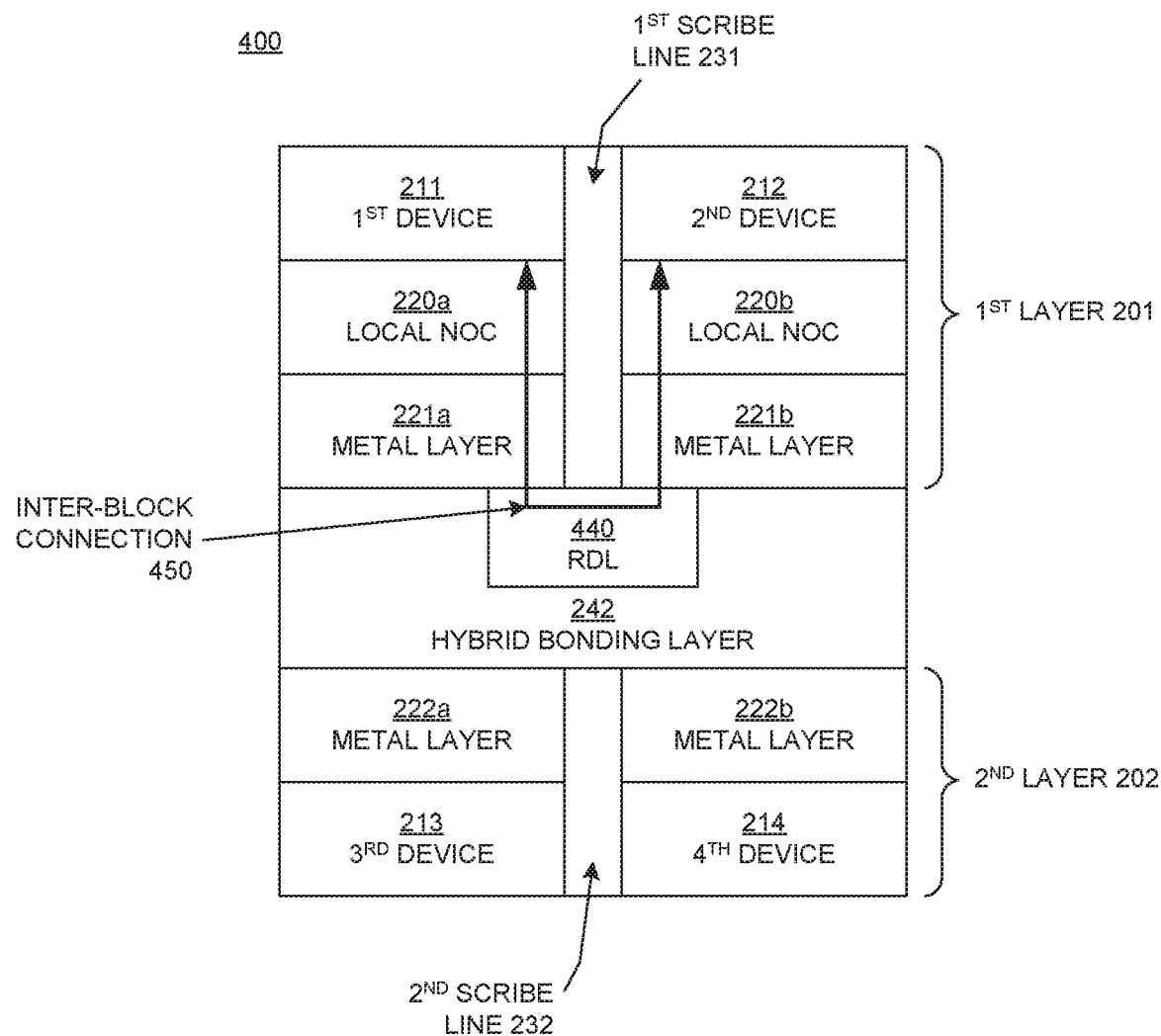

FIG. 4 is a block diagram of a multi-block chip or multi-block integrated circuit, referred to herein as a stacked chip 400, in embodiments according to the present invention.

Similar to the stacked chips 200 and 300 of FIGS. 2 and 3, respectively, the stacked chip 400 includes an electrically conductive connection (an inter-block connection 450) that traverses the first scribe line 231 and is connected to the first device 211 and the second device 212.

In contrast to the stacked chips 200 and 300, the inter-block connection 450 is achieved using a redistribution layer (RDL) 440 that includes wiring that connects the first device 211 and the second device 212.

The inter-block connection 450 thus permits communication (e.g., an exchange of electric signals) between the first device 211 and the second device 212. Other devices in the first layer 201 can be similarly connected.

Similar to the BEOL layer 340 of FIG. 3, the RDL 440 (and inter-block connection 450) can be added to stacked chips only when those stacked chips are intended for more complex uses (e.g., data centers) that require a multi-block chip.

Figure 5:
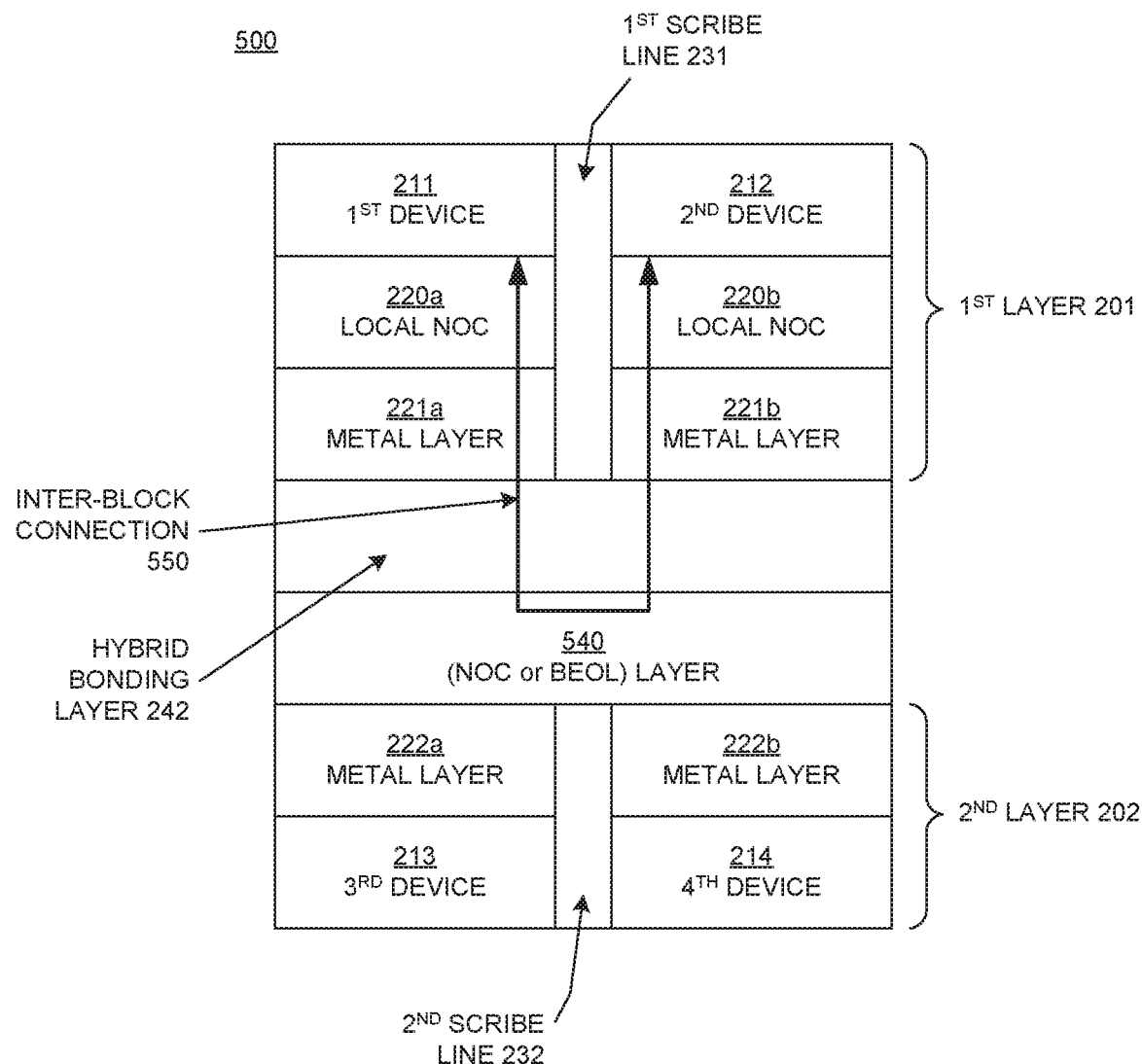

FIG. 5 is a block diagram of a multi-block chip or multi-block integrated circuit, referred to herein as a stacked chip 500, in embodiments according to the present invention.

In contrast to the stacked chips 200 and 300 of FIGS. 2 and 3, respectively, the stacked chip 500 includes an inter-block connection 550 that is achieved using a layer 540 that is between the second layer 202 and the hybrid bonding layer 242. The layer 540 can be a NOC architecture layer or a BEOL layer. The inter-block connection 550 uses wiring in the layer 540 and wiring in the hybrid bonding layer 242 to traverse the first scribe line 231 and connect the first device 211 and the second device 212.

The inter-block connection 550 thus permits communication (e.g., an exchange of electric signals) between the first device 211 and the second device 212. Other devices in the first layer 201 can be similarly connected.

When implemented as a BEOL layer, the layer 540 (and inter-block connection 550) can be added to stacked chips only when those stacked chips are intended for more complex uses (e.g., data centers) that require a multi-block chip. In other words, if the end-user intends to use the stacked chips in devices that require only a single-block chip, then the (BEOL) layer 540 need not be formed when the chips are manufactured or when the devices in the second layer 202 are manufactured. On the other hand, if the end-user intends to use the stacked chips in devices that require a multi-block chip, then the (BEOL) layer 540 is formed when the chips are manufactured or when the devices in the second layer 202 are manufactured.

Figure 6:
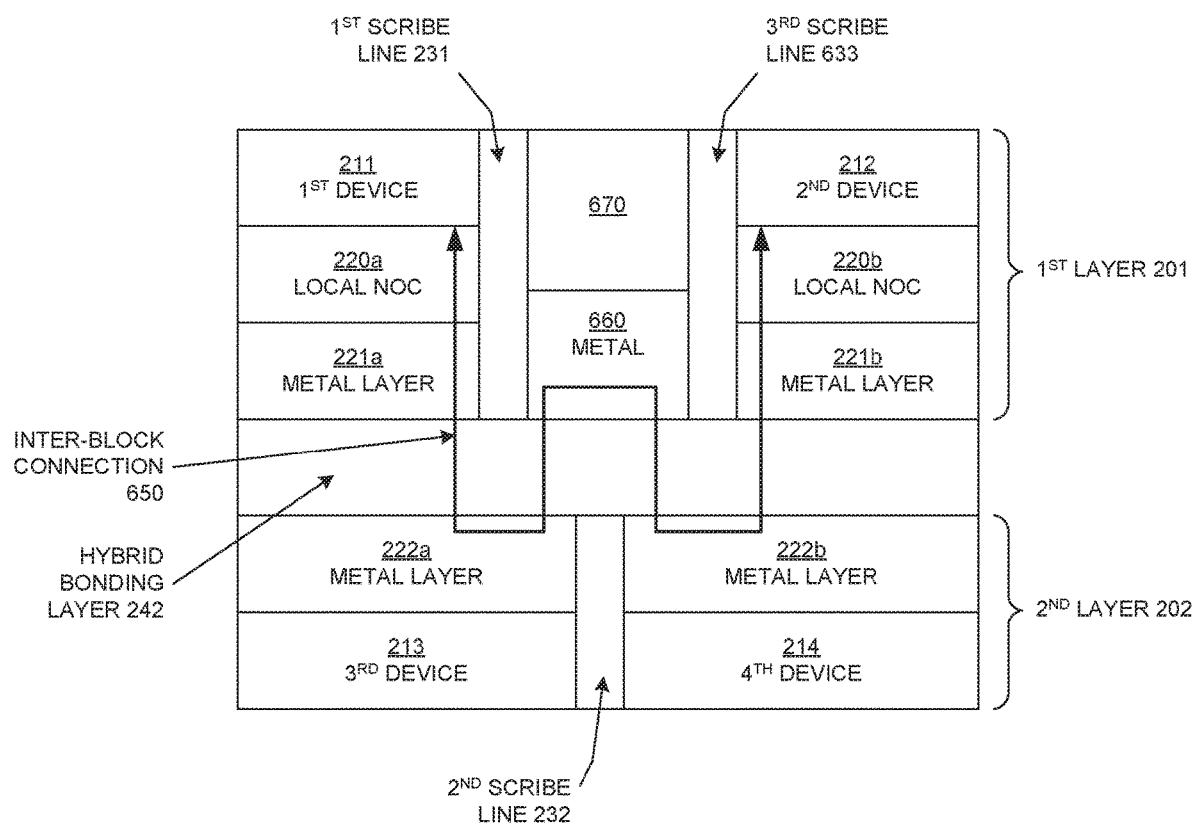

FIG. 6 is a block diagram of a multi-block chip or multi-block integrated circuit, referred to herein as a stacked chip 600, in embodiments according to the present invention.

The stacked chip 600 includes a third scribe line 633 located between the first device 211 and the second device 212, and between the first scribe line 231 and the second device 212. A volume of metal 660 is located between the first scribe line 231 and the third scribe line 633. The volume 670 can contain silicon but is not used.

An inter-block connection 650 traverses the scribe lines 231, 232, and 633 and connects the first device 211 and the second device 212. More specifically, the inter-block connection 650 between the first device 211 and the second device 212 includes a path from the metal layer 221a in the first layer 201, through the hybrid bonding layer 242, through the metal layer 222a in the second layer 202, back through the hybrid bonding layer 242, through the volume of metal 660, back through the hybrid bonding layer 242, through the metal layer 222b in the second layer 202, back through the hybrid bonding layer 242, to the metal layer 221b in the first layer 201.

The inter-block connection 650 thus permits communication (e.g., an exchange of electric signals) between the first device 211 and the second device 212. Other devices in the first layer 201 can be similarly connected.

In summary, embodiments according to the invention enable communication across scribe lines and between blocks, and allow block-based stacked chips to be scaled to larger, multi-block chips.

Figure 7:
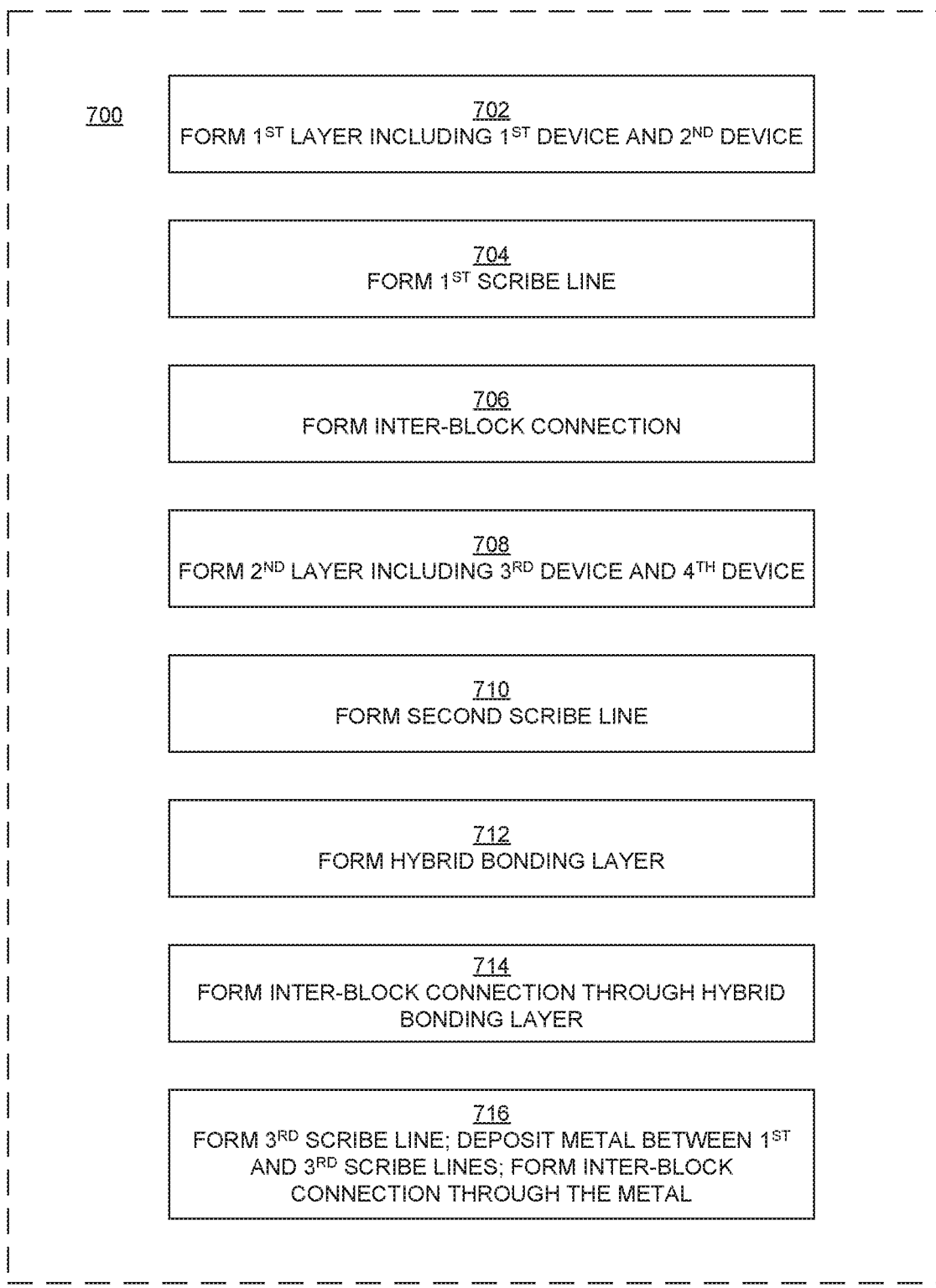
FIG. 7 is a flowchart of an example of a method for fabricating multi-block stacked chips like those in FIGS. 2-6, in embodiments according to the present invention.

FIG. 7 is a flowchart 700 of an example of a method or process for fabricating multi-block stacked chips like those described above in conjunction with FIGS. 2-6, in embodiments according to the present invention.

In FIG. 7, operations described as separate blocks may be combined and performed in the same process step (that is, in the same time interval, after the preceding process step and before the next process step). Also, the operations may be performed in a different order than the order in which they are described below. Furthermore, fabrication processes and steps may be performed along with the processes and steps discussed herein; that is, there may be a number of process steps before, in between, and/or after the steps shown and described herein. Importantly, embodiments according to the present invention can be implemented in conjunction with these other (perhaps conventional) processes and steps without significantly perturbing them. Generally speaking, embodiments according to the present invention can replace portions of a conventional process without significantly affecting peripheral processes and steps.

FIG. 7 is described with reference also to FIGS. 2-6. Blocks 702 and 704 pertain to the embodiments of FIGS. 2-6. In block 702, a first layer 201 that includes the first device 211 and a second device 212 is formed on a substrate (not shown).

In block 704, the first scribe line 231 is formed. The first scribe line 231 is located between the first device 211 and the second device 212, and separates the first device from the second device.

In block 706, in the embodiments of FIGS. 2-4, an electrically conductive inter-block connection (the connection 250, 350, or 450) is formed. The inter-block connection 250, 350, 450 traverses the first scribe line 231 and connects the first device 211 and the second device 212.

In some embodiments (e.g., the embodiments of FIGS. 5 and 6, and optionally the embodiments of FIG. 2-4), the method also includes the operations of blocks 708, 710, and 712.

In block 708, the second layer 202 that includes the third device 213 and the fourth device 214 is formed.

In block 710, the second scribe line 232 is formed. The second scribe line 232 is located between the third device 213 and the fourth device 214, and separates the third device from the fourth device.

In block 712, the hybrid bonding layer 242 is formed between the first layer 201 and the second layer 202.

In some embodiments (e.g., the embodiments of FIG. 5), in block 714, the layer 540 is formed between the hybrid bonding layer 242 and the second layer 202. The layer 540 includes wiring that is connected to the first device 211 and the second device 212 through the hybrid bonding layer 242, and thus the inter-block connection 550 is formed. The inter-block connection 550 traverses the first scribe line 231 and connects the first device 211 and the second device 212.

In other embodiments (e.g., the embodiments of FIG. 6), in block 716, the third scribe line 633 is formed between the first device 211 and the second device 212 and between the first scribe line 231 and the second device 212, and the volume of metal 660 is deposited between the first scribe line 231 and the third scribe line 633. The inter-block connection 650, which includes the path described above in the discussion of FIG. 6, is thereby formed. The inter-block connection 650 traverses the first scribe line 231 (and also the third scribe line 633) and connects the first device 211 and the second device 212.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

Although the subject matter has been described in language specific to structural features and/or methodological acts, it is to be understood that the subject matter defined in the disclosure is not necessarily limited to the specific features or acts described above. Rather, the specific features and acts described above are disclosed as example forms of implementing the disclosure.

Embodiments according to the invention are thus described. While the present disclosure has been described in particular embodiments, it should be appreciated that the invention should not be construed as limited by such embodiments, but rather construed according to the following claims.

What is claimed is:

1. An article of manufacture, comprising:
a first layer comprising a first device and a second device, wherein a first scribe line is located between the first device and the second device, and wherein the first scribe line separates the first device from the second device; and
an electrically conductive connection that traverses the first scribe line and is coupled to the first device and the second device.

2. The article of claim 1, wherein the electrically conductive connection comprises a network-on-a-chip (NOC) interconnection architecture layer comprising wiring coupled to the first device and the second device.

3. The article of claim 1, further comprising:
a second layer comprising a third device and a fourth device, wherein a second scribe line is located between the third device and the fourth device, wherein the second scribe line separates the third device from the fourth device, and wherein the electrically conductive connection is located between the first layer and the second layer; and
a hybrid bonding layer that is located between and is coupled to the first layer and the second layer.

4. The article of claim 3, wherein: the first device comprises a first processing element, the second device comprises a second processing element, the third device comprises a first memory element, and the fourth device comprises a second memory element.

5. An integrated circuit, comprising:
a first layer comprising a first processing element and a second processing element, wherein a first scribe line is located between the first processing element and the second processing element, and wherein the first scribe line separates the first processing element from the second processing element;
a second layer comprising a first device and a second device, wherein a second scribe line is located between the first device and the second device, and wherein the second scribe line separates the first device from the second device;
a hybrid bonding layer that is located between and is coupled to the first layer and the second layer; and
an electrically conductive connection that traverses the first scribe line and is coupled to the first processing element and the second processing element, wherein the electrically conductive connection is located between the first layer and the second layer.

6. The integrated circuit of claim 5, wherein the electrically conductive connection comprises a network-on-a-chip (NOC) interconnection architecture layer comprising wiring coupled to the first processing element and the second processing element.

7. The integrated circuit of claim 5, wherein the first device is selected from a group consisting of: a processing element, and a memory element, and wherein the second device is selected from a group consisting of: a processing element, and a memory element.

8. A method of fabricating an integrated circuit, the method comprising:
forming, on a substrate, a first layer comprising a first device and a second device;
forming a first scribe line, wherein the first scribe line is located between the first device and the second device, and wherein the first scribe line separates the first device from the second device; and
forming an electrically conductive connection that traverses the first scribe line and is coupled to the first device and the second device.

9. The method of claim 8, wherein said forming the electrically conductive connection comprises forming a network-on-a-chip (NOC) interconnection architecture layer comprising wiring coupled to the first device and the second device.

10. The method of claim 8, further comprising:
- forming a second layer comprising a third device and a fourth device;
- forming a second scribe line, wherein the second scribe line is located between the third device and the fourth device, wherein the second scribe line separates the third device from the fourth device, and wherein the electrically conductive connection is located between the first layer and the second layer; and
- bonding the first layer and the second layer, said bonding comprising forming a hybrid bonding layer between and coupled to the first layer and the second layer.

\* \* \* \* \*